United States Patent
Kondo

(10) Patent No.: US 10,009,006 B2
(45) Date of Patent: Jun. 26, 2018

(54) RESONATOR DEVICE, ELECTRONIC APPARATUS, AND MOVING OBJECT

(71) Applicant: SEIKO EPSON CORPORATION, Tokyo (JP)

(72) Inventor: Manabu Kondo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 702 days.

(21) Appl. No.: 14/575,528

(22) Filed: Dec. 18, 2014

(65) Prior Publication Data
US 2015/0179919 A1 Jun. 25, 2015

(30) Foreign Application Priority Data
Dec. 25, 2013 (JP) ................................. 2013-266617

(51) Int. Cl.
| | |
|---|---|
| *H03H 9/08* | (2006.01) |
| *H01L 41/08* | (2006.01) |
| *H03H 9/10* | (2006.01) |
| *H03H 9/05* | (2006.01) |

(52) U.S. Cl.
CPC ........ *H03H 9/1028* (2013.01); *H03H 9/0547* (2013.01); *H03H 9/08* (2013.01)

(58) Field of Classification Search
CPC ....... H03H 9/1028; H03H 9/0547; H03H 9/08
USPC ................ 310/343, 348, 341, 344, 345, 361
See application file for complete search history.

(56) References Cited

U.S. PATENT DOCUMENTS

| | | | | |
|---|---|---|---|---|
| 3,715,563 A | * | 2/1973 | Bloch | G05D 23/2401 310/343 |
| 4,985,687 A | * | 1/1991 | Long | H03L 1/04 310/343 |
| 5,917,272 A | * | 6/1999 | Clark | H03H 9/08 310/343 |
| 7,514,852 B2 | | 4/2009 | Kasahara et al. | |

FOREIGN PATENT DOCUMENTS

| | | |
|---|---|---|
| EP | 2 228 903 A1 | 9/2010 |
| JP | A-11-145728 | 5/1999 |
| JP | A-2001-500715 | 1/2001 |
| JP | A-2002-198739 | 7/2002 |
| JP | 2005-528829 A | 9/2005 |
| JP | A-2007-6270 | 1/2007 |
| JP | A-2009-005117 | 1/2009 |
| JP | A-2010-213280 | 9/2010 |
| WO | WO 99/65087 | 12/1999 |
| WO | 2003-100876 A2 | 12/2003 |

* cited by examiner

*Primary Examiner* — Thomas Dougherty
*Assistant Examiner* — Karen B Addison
(74) *Attorney, Agent, or Firm* — Oliff PLC

(57) ABSTRACT

A resonator device capable of preventing the characteristics of the resonator element from degrading while ensuring the fixation strength of the resonator element is provided. A vibrator as the resonator device includes a heat generation element as a base body, a first support arm and a second support arm as elastic members each constituting a plate spring having one end connected to the heat generation element and extending from the one end toward the other end disposed at a position distant from the heat generation element, and a resonator element connected to a first support section and a second support section respectively disposed on the other end side of the first support arm and the second support arm so as to be distant from the heat generation element.

16 Claims, 12 Drawing Sheets

RESONATOR DEVICE, ELECTRONIC APPARATUS, AND MOVING OBJECT

BACKGROUND

1. Technical Field

The present invention relates to a resonator device, an electronic apparatus, and a moving object each using the resonator device.

2. Related Art

In the past, there has been disclosed a resonator device having a structure in which a heating unit is disposed on an active surface of an integrated circuit chip (an oscillator circuit element), a resonator element is directly connected to the active surface of the integrated circuit chip using flip-chip bonding, an electrically-conductive adhesive, or the like to heat the resonator element (e.g., JP-A-2010-213280).

In the resonator device having the configuration described above, the resonator element is directly fixed to the active surface of the integrated circuit chip using a cantilever support structure. In the case in which the resonator element is directly fixed in such a manner as described above, a stress of the resonator element caused by a temperature change and so on is difficult to be diffused from the fixation section, and degradation of the resonator characteristic of the resonator element might occur due to the influence of the stress. In order to reduce the influence of such a stress on the resonator element, it is effective to decrease the area of the fixation section.

However, in the cantilever support configuration described above, in the case in which a drop impact or the like is applied to the resonator element, the impact stress is concentrated to the fixation section of the cantilever structure. Therefore, a problem that the resonator element is peeled off apt to occur, and there is a problem that the area of the fixation section cannot be decreased.

SUMMARY

An advantage of some aspects of the invention is to solve at least apart of the problems described above, and the invention can be implemented as the following forms or application examples.

Application Example 1

A resonator device according to this application example includes a base body, an elastic member having one end connected to the base body, extending from the one end, and provided with a support section disposed at a position distant from the base body, and a resonator element connected to the support section.

According to this application example, the resonator element is connected to the support section of the elastic member connected to the base body, the support section being disposed distantly from the base body. Since the resonator element is supported by the elastic member supported by the base body using a cantilever structure as described above, the stress of the resonator element caused by the temperature change and so on is absorbed or released by elastic member, and thus, the degradation of the resonator characteristics of the resonator element due to the influence of the stress can be prevented. Further, since the stress of the resonator element can be absorbed or released by the elastic member, it becomes possible to increase the fixation area of the resonator element, and in addition, due to the buffering effect of the impact force and so on obtained by supporting the resonator element with the elastic member, it becomes possible to improve the support strength of the resonator element.

Application Example 2

In the resonator device according to the application example described above, it is preferable that the elastic member is a spring member extending so as to have an elongated shape in a planar view, and provided with a bent section.

According to this application example, the resonator element is supported by the spring member extending so as to have an elongated shape in a planar view, and provided with a bent section. In the elastic member having such a configuration, since the degree of freedom of deformation (deflection) when a stress is applied is increased, the absorption and the release of the stress when supporting the resonator element are easily achieved, and thus, the degradation of the resonator characteristics of the resonator element can be prevented. Further, since the buffering effect for the impact force is also increased, it becomes possible to increase the support strength of the resonator element.

Application Example 3

In the resonator device according to the application example described above, it is preferable that the plurality of elastic members is disposed, and in the elastic members, the extending direction is a direction toward a first region, which is one of regions divided by an imaginary line passing through a center of the base body, and the plurality of support sections is disposed in the first region.

According to this application example, since the resonator element is fixed by each support section of the elastic members disposed in the first region (the one side of the base body) on the one side, the degree of the freedom of the deformation (deflection) when the stress is applied is increased, and thus, the fixation posture of the resonator element can further be stabilized, and at the same time, it becomes possible to surely achieve the fixation of the resonator element.

Application Example 4

In the resonator device according to the application example described above, it is preferable that there is further included a base substrate having a space in which the resonator element is installed, and the base body is connected to the base substrate.

According to this application example, since the base body is connected to the base substrate, it becomes possible to install the resonator element in the space provided to the base substrate. In other words, the resonator element can be installed with good space efficiency.

Application Example 5

In the resonator device according to the application example described above, it is preferable that the base body is provided to the base substrate.

According to this application example, since the base body is provided to the base substrate, the resonator element can be housed in the space of the base substrate for installing the resonator element without separately disposing the base body. In other words, the resonator element can be installed with good efficiency in the space for installing the resonator element as a limited space.

Application Example 6

In the resonator device according to the application example described above, it is preferable that the base body is a heat generation member.

According to this application example, the elastic member is connected to the base body, and the resonator element is fixed to the connecting member. According to such a configuration, it becomes possible to efficiently conduct the heat energy generated by the base body as the heat generation member to the resonator element via the elastic member.

Application Example 7

In the resonator device according to the application example described above, it is preferable that the base body and the elastic member are connected to each other with an electrically-conductive member.

According to this application example, the fixation of the elastic member can be achieved while providing the electrical conductivity between the base body and the elastic member.

Application Example 8

In the resonator device according to the application example described above, it is preferable that the base body is provided with an electrode disposed on one surface, and the elastic member is connected to the electrode.

According to this application example, since the elastic member can directly be connected to the electrode, the space efficiency in the installation of the elastic member can be improved.

Application Example 9

In the resonator device according to the application example described above, it is preferable that the elastic member and the resonator element are connected to each other with a connecting member having electrical conductivity.

According to this application example, it becomes possible to easily ensure the electrical conductivity while achieving the stress relaxation of the resonator element.

Application Example 10

In the resonator device according to the application example described above, it is preferable that the resonator element is provided with excitation electrodes disposed on obverse and reverse surfaces, and one of the excitation electrodes is electrically connected to the base body with wire bonding.

According to this application example, since the connection between one of the excitation electrodes and the base body is achieved by the wire bonding, it is sufficient to dispose a single fixation section for achieving the electrical connection between the elastic member and the resonator element. Thus, it becomes possible to further reduce the fixation area of the resonator element to thereby reduce the influence of the fixation on the resonator characteristics of the resonator element.

Application Example 11

In the resonator device according to the application example described above, it is preferable that the space for the installation is airtightly sealed with a lid member bonded to the base substrate.

According to this application example, it is possible to provide a resonator device having the base body and the resonator element housed in the space for the installation airtightly sealed with the lid member. Therefore, since the base body and the resonator element are airtightly held in the installation space, it becomes possible to make the resonator device capable of maintaining more stable characteristics.

Application Example 12

An electronic apparatus according to this application example includes the resonator device according to any one of the application examples described above.

According to this application example, since there is used the resonator device capable of preventing the degradation of the resonator characteristics due to the stress and the degradation of the resonator characteristics due to the drop impact and so on, it becomes possible to provide the electronic apparatus capable of maintaining the more stable characteristics.

Application Example 13

A moving object according to this application example includes the resonator device according to anyone of the application examples described above.

According to this application example, since there is used the resonator device capable of preventing the degradation of the resonator characteristics due to the stress and the degradation of the resonator characteristics due to the drop impact and so on, it becomes possible to provide the moving object capable of maintaining the more stable characteristics.

BRIEF DESCRIPTION OF THE DRAWINGS

The invention will be described with reference to the accompanying drawings, wherein like numbers reference like elements.

FIGS. 1A and 1B are diagrams showing a general configuration of a vibrator according to a first embodiment of the resonator device according to the invention, wherein FIG. 1A is a plan view, and FIG. 1B is a front cross-sectional view.

FIGS. 4A and 4B are diagrams showing an example of a plate spring, wherein FIG. 4A is a plan view, and FIG. 4B is a front view.

FIGS. 6A and 6B are diagrams showing a general configuration of a vibrator according to a second embodiment of the resonator device according to the invention, wherein FIG. 6A is a plan view, and FIG. 6B is a front cross-sectional view.

FIGS. 7A and 7B are diagrams showing an example of a plate spring, wherein FIG. 7A is a plan view, and FIG. 7B is a front view.

FIGS. 8A and 8B are diagrams showing a general configuration of a vibrator according to a third embodiment of the resonator device according to the invention, wherein FIG. 8A is a plan view, and FIG. 8B is a front cross-sectional view.

FIGS. 10A and 10B are diagrams showing a modified example of a plate spring, wherein FIG. 10A is a plan view, and FIG. 10B is a front view.

DESCRIPTION OF EXEMPLARY EMBODIMENTS

Some preferred embodiments of the invention will hereinafter be described with reference to the accompanying drawings.

First Embodiment

Figure 1A:
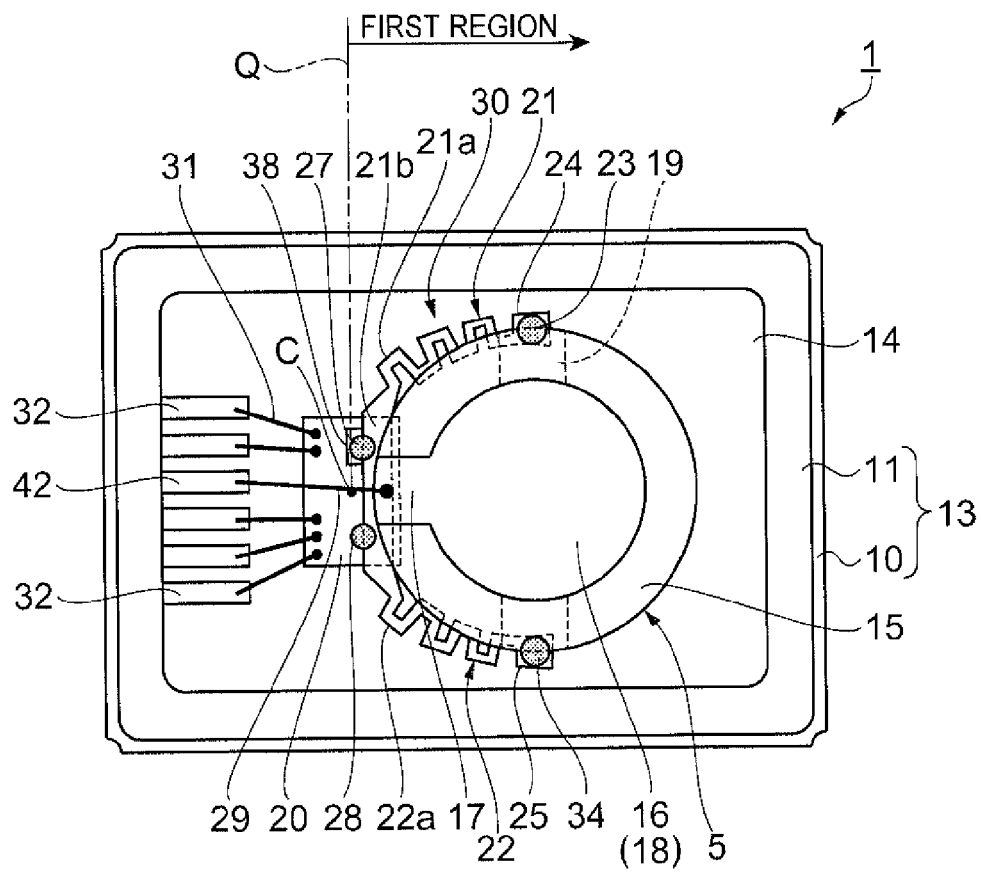
Figure 1B:
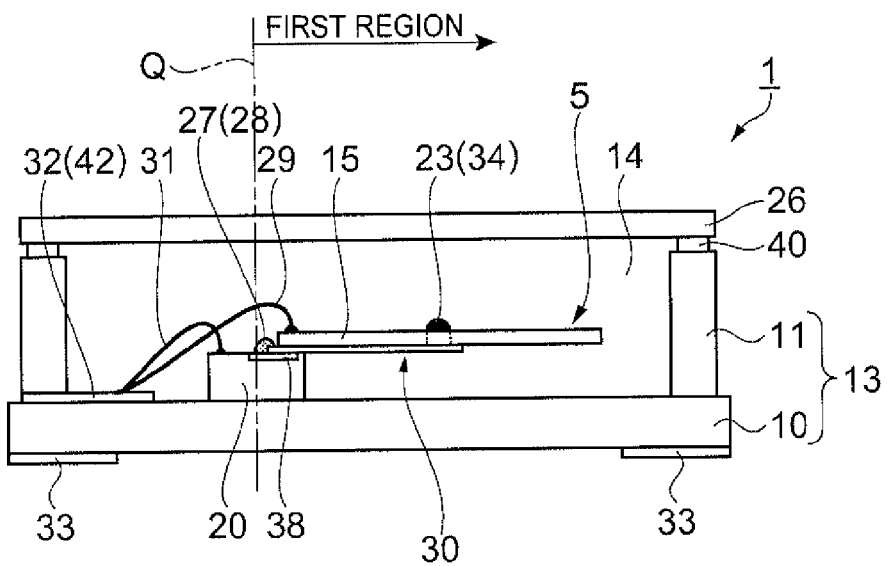

A vibrator according to the first embodiment of the resonator device according to the invention will be explained using FIGS. 1A and 1B. FIGS. 1A and 1B are diagrams showing a general configuration the vibrator according to the first embodiment of the resonator device according to the invention, wherein FIG. 1A is a plan view, and FIG. 1B is a front cross-sectional view. It should be noted that in order to make the drawings easy to understand, a diagram omitting (seen through) a lid member is used as FIG. 1A, and a diagram omitting excitation electrodes of a resonator element is used as FIG. 1B.

Vibrator

The vibrator 1 according to the first embodiment shown in FIGS. 1A and 1B includes a resonator element 15 using a resonator substrate 5, a heat generation element 20 (a heat generation member) as a base body for supporting the resonator element 15, a plate spring 30 disposed for attaching the resonator element 15 to the heat generation element 20 as the base body, a package 13 for housing the resonator element 15, the heat generation element 20, and so on, and a lid 26 as a lid member for forming an internal space 14 as a housing space (a space for installation) with the package 13. Hereinafter, the resonator element 15, the package 13, the heat generation element 20 as the base body, the plate spring 30, and the lid 26 will sequentially be explained in detail.

Resonator Element

Figure 2A:
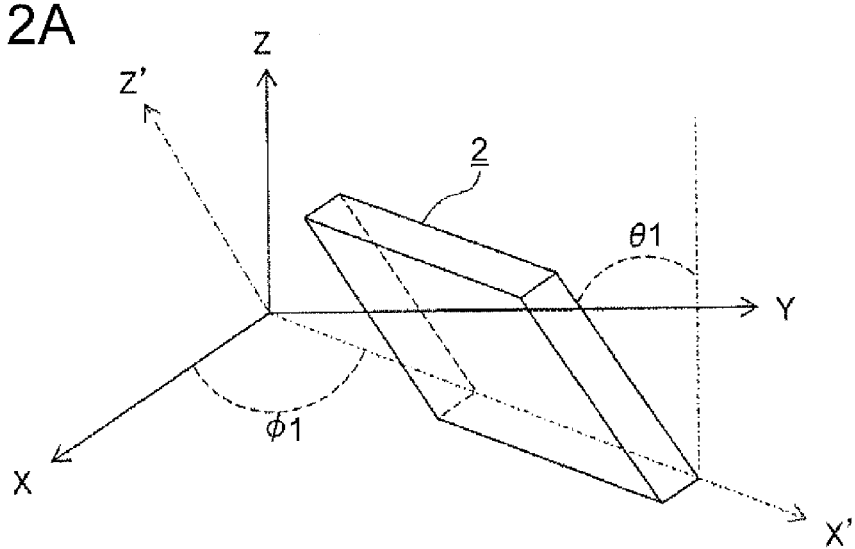
FIGS. 2A and 2B are diagrams showing a carving-out method of an SC-cut crystal substrate.
Figure 2B:
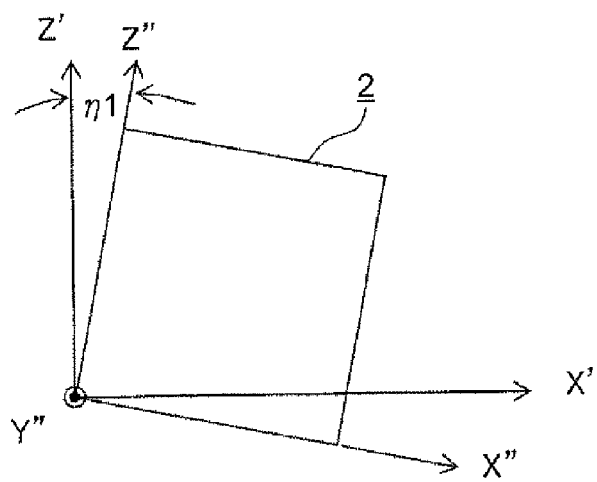

In the resonator element 15 according to the present embodiment, there is used an SC-cut crystal substrate (a piezoelectric substrate) formed of a quartz crystal as an example of the piezoelectric material. Here, the SC-cut crystal substrate (the piezoelectric substrate) will be explained with reference to FIGS. 2A and 2B. FIGS. 2A and 2B are schematic diagrams showing a configuration of the SC-cut crystal substrate. It should be noted that in order to prevent the drawing from becoming complicated, the graphical description will be divided into FIGS. 2A and 2B. As shown in FIG. 2A, the SC-cut crystal substrate 2 of the present embodiment is a crystal substrate obtained through two rotations ($\phi 1$, $\theta 1$) of an orthogonal coordinate system (X, Y, Z) as shown in FIG. 2A and subsequent one rotation ($\eta 1$) of an orthogonal coordinate system (X', Y'', Z') as shown in FIG. 2B. The quartz crystal belongs to a trigonal system, and has the crystal axes X, Y, and Z perpendicular to each other. The X axis, the Y axis, and the Z axis are called an electrical axis, a mechanical axis, and an optical axis, respectively. The Z axis is a three-fold symmetry axis having sets of the X axis and the Y axis at 120° intervals around the Z axis, and the X axis is a two-fold symmetry axis. As shown in FIG. 2A, the configuration of the quartz crystal is described using the orthogonal coordinate system (X, Y, Z) formed of the X axis as the electrical axis, the Y axis as the mechanical axis, and the Z axis as the optical axis.

As shown in FIG. 2A, in the SC-cut crystal substrate 2, a rotation is first performed around the X axis of the orthogonal coordinate system (X, Y, Z) as much as a predetermined angle $\phi 1$ (e.g., 34°) to obtain a new orthogonal coordinate system (X, Y', Z'), then a rotation is performed around the Z' axis of the new coordinate system (X, Y', Z') as much as a predetermined angle $\theta 1$ (e.g., 22°), and then the orthogonal coordinate system obtained by this rotation is defined as (X', Y'', Z'). By carving out a substrate having a rectangular shape having the thickness direction parallel to the Y''-axis direction, and the both principal surfaces each including an X'-Z' plane (a plane constituted by the X' axis and the Z' axis), the normal SC-cut crystal substrate 2 can be obtained.

Further, as shown in FIG. 2B, by making a rotation around the Y'' axis of the orthogonal coordinate system (X', Y'', Z') as much as $\eta 1$ in addition to the two rotations described above, a new orthogonal coordinate system (X'', Y'', Z'') can be obtained. In the new orthogonal coordinate system (X'', Y'', Z''), by carving out a substrate having a rectangular shape having the thickness direction parallel to the Y''-axis direction, and the both principal surfaces each including an X''-Z'' plane (a plane constituted by the X' axis and the Z'' axis), the normal SC-cut crystal substrate 2 can also be obtained. The SC-cut crystal substrate 2 of the present embodiment is a crystal substrate, in which one of the pairs of sides opposed to each other of the SC-cut crystal substrate 2 having the rectangular shape are parallel to the X'' axis, the other of the pairs of sides opposed to each other are parallel to the Z'' axis, and the Y''-axis direction corresponds to the thickness direction.

Further, the flat plate carved out from such an SC-cut crystal substrate 2 is used as the resonator substrate (the resonator element 15) of the present embodiment.

It should be noted that the crystal substrate according to the invention is not limited to the SC-cut substrate with the angle described above, but the invention can also be applied widely to other piezoelectric substrates such as an AT-cut substrate or a ET-cut substrate vibrating in the thickness-shear vibration mode. For example, in the case of the AT-cut crystal substrate, the Y axis and the Z axis are both rotated roughly 35°15' taking the X axis as the rotational axis to thereby obtain the Y' axis and the Z' axis, respectively. Therefore, the AT-cut crystal substrate has the crystal axes X, Y', and Z' perpendicular to each other. In the AT-cut crystal substrate, the thickness direction is parallel to the Y'-axis direction, the principal surface is a surface including the X-Z' plane (the plane including the X axis and the Z' axis) perpendicular to the Y' axis, and the AT-cut crystal substrate vibrates taking the thickness-shear vibration as the principal vibration. By processing the AT-cut quartz crystal substrate, the piezoelectric substrate as a raw plate of the resonator element 15 can be obtained.

As shown in FIGS. 1A and 1B, in the resonator element 15 of the present embodiment, a variety of electrodes are formed on the first principal surface and the second principal surface having an obverse-reverse relationship with each other of the resonator substrate 5 having a disk-like shape formed of the SC-cut crystal substrate 2 described above. In the present embodiment, excitation electrodes 16, 18 and connection electrodes 17, 19 are formed as the electrodes. The excitation electrode 16 has a roughly circular shape, and is formed in the central portion of the obverse principal surface (the first principal surface) in the resonator substrate 5 (the resonator element 15). Further, the connection electrode 17 is formed on one outer circumferential end side of the obverse principal surface (the first principal surface), one end portion of the connection electrode 17 is connected to the excitation electrode 16, and the other end portion thereof extends toward an outer edge of the resonator substrate 5. Further, the excitation electrode 18 has a roughly circular shape, and is located in the central portion of the reverse principal surface (the second principal surface) in the resonator substrate 5 (the resonator element 15), and is formed so as to roughly completely overlap the excitation electrode 16 on the obverse side in a planar view. The connection electrode 19 is formed on one outer circumferential end side of the reverse principal surface (the second principal surface) so as to intersect with the connection electrode 17 on the obverse principal surface at an angle of roughly 90° in a planar view, one end portion of the connection electrode 19 is connected to the excitation electrode 18, and the other end portion thereof extends toward an outer edge of the resonator substrate 5. It should be noted that the angle at which the extending direction of the connection electrode 19 and the extending direction of the connection electrode 17 intersects with each other is not limited to roughly 90°, but can take any values providing the connection electrode 19 is disposed at a position where the connection electrode 19 is supported by the plate spring 30 and can electrically be connected.

Package

The package 13 as a base substrate shown in FIGS. 1A and 1B has a bottom plate 10 and a side wall 11 having a frame-like shape disposed on a circumferential edge portion of one surface of the bottom plate 10. The package 13 is for housing the resonator element 15. Further, on the upper surface of the side wall 11, there is disposed a seal ring 40 as a bonding material.

The package 13 as the base substrate has a recessed section (an internal space 14) as a housing space opening in the upper surface. The opening of the recessed section is blocked by the lid 26 as the lid member bonded to the side wall 11 via the seal ring 40 as the bonding material. Thus, there is formed the internal space 14 (the housing space) sealed by blocking the opening of the recessed section of the package 13. The inner pressure of the internal space 14 thus sealed can be set to a desired pressure. By, for example, filling the internal space 14 with a nitrogen gas to have the atmospheric pressure, or by producing a vacuum state (the state of a space filled with a gas at a pressure (not higher than $1 \times 10^5$ Pa through $1 \times 10^{-10}$ Pa (JIS Z 8126-1: 1999)) lower than the normal atmospheric pressure) in the internal space 20, it is possible to continue a more stable vibration of the resonator element 15. It should be noted that the internal space 14 of the present embodiment is set to the vacuum described above.

The side wall 11 having the frame-like shape is disposed to have a roughly rectangular rim-like shape, and in other words, the opening shape of the opening in the upper surface of the recessed section described above is a roughly rectangular shape. The recessed section surrounded by the bottom plate 10 having a plate-like shape, a frame-like substrate 12, and the side wall 11 forms the internal space (the housing space) 14 for housing the resonator element 15. The seal ring 40 as the bonding material disposed on the upper surface of the side wall 11 is formed of, for example, an alloy such as kovar. The seal ring 40 has a function as the bonding material between the lid 26 as the lid member and the side wall 11, and is disposed along the upper surface of the side wall 11 so as to have a frame-like shape (a roughly rectangular rim-like shape in the present embodiment). It should be noted that the opening shape of the side wall 11 is not limited to a roughly rectangular shape, but can also be other shapes.

The package 13 is formed of a material having a thermal expansion coefficient equal or as close as possible to the thermal expansion coefficient of the resonator element 15 and the lid 26, and ceramic is used as the material in the present embodiment. The package 13 is formed by stacking and then calcining green sheets having been formed to have predetermined shapes. It should be noted that the green sheets are each a material obtained by forming a mixture, which is generated by, for example, dispersing ceramic powder in a predetermined solution and then adding a binder, to have a sheet-like shape.

On the upper surface of the bottom plate 10 constituting the package 13, there is disposed a plurality of (five in the present embodiment) PAD electrodes 32. The PAD electrodes 32 are each formed by forming the necessary shape using, for example, an electrically-conductive paste made of a silver-palladium alloy or the like, or tungsten metalizing, then performing a calcination treatment, and then plating the result with nickel, gold, silver, or the like. The PAD electrodes 32 are connected to electrode pads (not shown) of the heat generation element 20 as the base body described later via bonding wires 31, respectively. Further, some of the PAD electrodes 32 are electrically connected to external connection electrodes 33 formed on the outer bottom portion of the package 13. It should be noted that the number of the PAD electrodes 32 installed is not limited to five, but can also be any numbers.

Heat Generation Element

Figure 3:
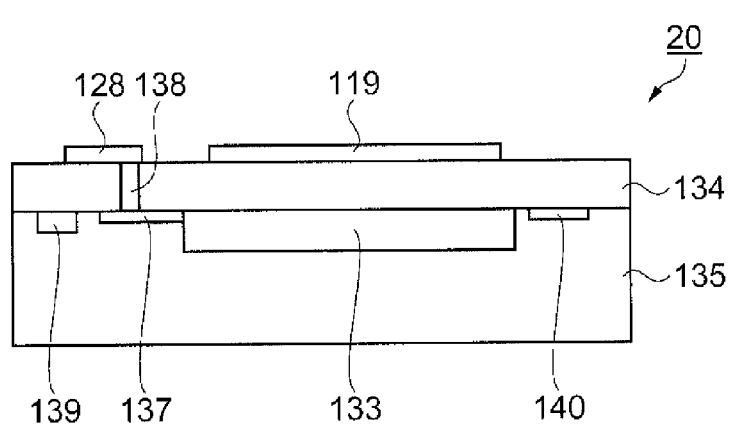
FIG. 3 is a front cross-sectional view schematically showing a general configuration of a heat generation element (a heat generation member) as a base body.

A general configuration of the heat generation element (the heat generation member) as the base body will be explained using FIG. 3. FIG. 3 is a front cross-sectional view schematically showing the general configuration of the heat generation element (the heat generation member) as the base body. The heat generation element 20 shown in FIG. 3 is an electrical component having a so-called constant-temperature function for heating the resonator element 15 connected via the plate spring 30 to keep the temperature of the resonator element 15 constant.

As shown in FIG. 3, the heat generation element (the heat generation member) 20 as the base body has a heat generating body 133 formed of a power transistor and so on, a temperature sensor 140, a functional element 139, and so on disposed on the functional surface side of the substrate 135 formed of semiconductor or the like. Temperature control is performed by the temperature sensor 140 on the heat generation body 133, and the heat generation body 133 can be kept at a constant temperature. On the functional surface, there is disposed an intermediate layer 134 as an electrically insulating body. On the upper surface of the intermediate layer 134, there are disposed a heat-conducting layer 119 disposed so as to be opposed to the heat generation body 133, and bonding pads 128 or connection terminals 38 (see FIGS. 1A and 1B) connected to the heat generation body 133 or the functional element 139 using a connection wiring layer 137, other wiring layers not shown, through electrodes 138, and so on. The heat-conducting layer 119 is disposed so as to be opposed to the heat generation body 133, and can therefore transfer the heat (the heat energy) from the heat generation body 133 to the heat-conducting layer 119 with the large area. In other words, the heat from the heat generation body 133 can efficiently be conducted to the heat-conducting layer 119. It should be noted that the heat generation element 20 can have other configurations such as a configuration not provided with the intermediate layer 134 described above.

As shown in FIGS. 1A and 1B, the heat generation element 20 as the base body is fixed to the bottom plate 10 for constituting the package 13 with a resin adhesive (not shown) or the like. In the heat generation element 20, the plate spring 30 is connected on the heat-conducting layer 119. Further, the heat generation element 20 is connected to the resonator element 15 via the plate spring 30. The details of the connection will be explained in the paragraph of "Connection of Resonator Element" described later. The bonding pads 128 (not shown in FIGS. 1A and 1B) provided to the heat generation element 20 are electrical connection electrodes, and are electrically connected to the PAD electrodes 32 disposed on the bottom plate 10 of the package 13, respectively, using bonding wires (metal wiring) 31.

Plate Spring

Figure 4A:
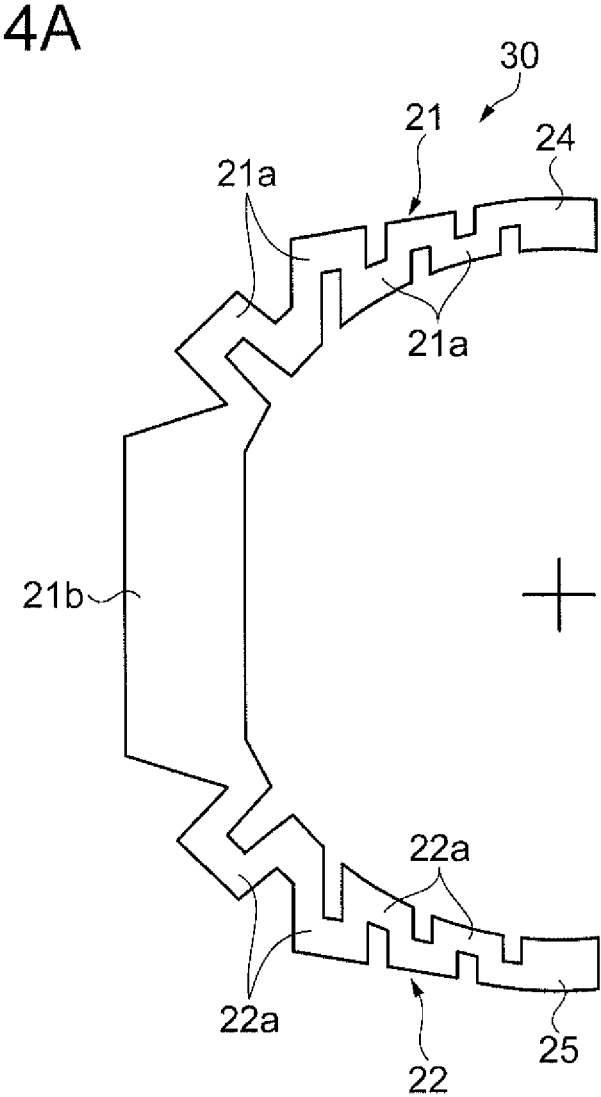
Figure 4B:
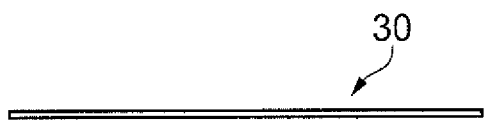

Here, the plate spring 30 will be explained in detail with reference to FIGS. 4A and 4B. FIGS. 4A and 4B are diagrams showing an example of the plate spring, wherein FIG. 4A is a plan view, and FIG. 4B is a front view. The plate spring 30 has a function of holding the resonator element 15, and at the same time, heating the resonator element 15 connected to the heat generation element 20 via a first support arm 21 and a second support arm 22, and providing the electrical conduction between the excitation electrode 18 of the resonator element 15 and the heat generation element 20.

Such a plate spring 30 as shown in FIGS. 4A and 4B is formed of a plate material having a thickness of roughly 0.05 mm, and has the first support arm 21 and the second support arm 22 extending from a base section 21b on one side as two support arms as elastic members. The first support arm 21 and the second support arm 22 are disposed so as to have roughly line-symmetric shapes about a center line (an imaginary line) passing through the center of the resonator element 15 in a direction along a long side of the package 13. Further, the first support arm 21 and the second support arm 22 are separated from the heat generation element 20 as the base body, and at the same time, supported using a cantilever structure so as to be positioned in the air in the internal space 14, which is a first region as one of the regions divided by an imaginary line Q passing through the center C of the heat generation element 20. The first support arm 21 as the elastic member extends from the one end side of the base section 21b so as to have a thin width shape of about 0.2 mm through 0.3 mm, and the second support arm 22 as the elastic member extends from the other end side opposite to the one end side of the base section 21b so as to have a thin width shape of about 0.2 mm through 0.3 mm. It should be noted that it is preferable that the plate spring 30 is formed with the thickness of 0.025 mm through 0.20 mm. By adopting the plate spring 30 having such a thickness, it becomes possible to make the plate spring 30 easy to form, capable of surely holding the resonator element 15, and suitable for the stress relaxation in the thickness direction of the resonator element 15. Further, the base section 21b of the plate spring 30 is mounted on the functional surface of the heat generation element 20 and is connected to the connection terminal 38 (an electrode) disposed on the functional surface side with the electrically-conductive adhesive 27 as an electrically-conductive member. It should be noted that as shown in the drawings, it is also possible to perform the connection using the electrically-conductive adhesive 28 in another connection position.

Further, in the connection between the plate spring 30 and the heat generation element 20, a metal bonding material (e.g., a gold bump) or an alloy bonding material (e.g., a bump made of a gold-tin alloy or solder) can be used as the electrically-conductive material. By performing such connection, the connection between the plate spring 30 and the heat generation element 20 achieving the electrical connection can easily be performed.

In the end portion of the first support arm 21 on the opposite side to the base section 21b, there is disposed a first support section 24 for supporting the resonator element 15. Similarly, in the end portion of the second support arm 22 on the opposite side to the base section 21b, there is disposed a second support section 25 for supporting the resonator element 15. In a portion of the first support arm 21 between the base section 21b and the first support section 24, there is disposed a plurality of bent portions 21a alternately folded while extending to form a thin-width shape. Similarly, in a portion of the second support arm 22 between the base section 21b and the second support section 25, there is disposed a plurality of bent portions 22a alternately folded while extending to form a thin-width shape. By providing the pluralities of bent portions 21a, 22a respectively to the first support arm 21 and the second support arm 22 as described above, it is possible to make it easier for the plate spring 30 to be deflected in the planar direction, and in the case of connecting the resonator element 15 to the plate spring 30, the relaxation of the stress in the planar direction generated in the resonator element 15 can efficiently be achieved. It should be noted that the first support arm 21 and the second support arm 22 preferably extend so as to have a roughly circular arc shape along the outer edge of the resonator element 15 as shown in the drawing. Since the first support arm 21 and the second support arm 22 are each configured so as to have the roughly circular arc shape, the stress relaxation effect by the bent portions 21a, 22a can be obtained while increasing the rigidity thereof in the planar direction of the plate spring 30.

The outer shape of the plate spring 30 is formed by performing an etching process on a plate material having a spring property (elasticity) such as a phosphor-bronze plate as an example of a copper alloy. It should be noted that as the material for forming the plate spring 30, any elastic materials can be used, but copper or other copper alloys (e.g., beryllium copper) is preferably used. Since copper, the phosphor-bronze plate, or other copper alloys such as beryllium copper has a high electrical conductivity, a good heat conductivity, and a good spring property, by using copper, the phosphor-bronze plate or other copper alloys such as beryllium copper as the elastic material, the stress relaxation of the resonator element 15 can also be achieved while ensuring the electrical conductivity and the conductivity of the heat energy between the resonator element 15 and the heat generation element 20.

Attachment of Resonator Element

The resonator element 15 is housed inside the recessed section surrounded by the side wall 11 of the package 13. The resonator element 15 is disposed so that the connection electrode 17 on the obverse principal surface (the first principal surface) and the base section 21b of the plate spring 30 overlap each other, and the connection electrode 19 on the reverse principal surface (the second principal surface) side and the first support section 24 of the first support arm 21 overlap each other in a planar view. Further, the connection electrode 19 of the resonator element 15 and the first support section 24 are connected to each other with, for example, an electrically-conductive adhesive 23 including polyimide resin as a connecting member. Further, in the second support section 25, the connection is achieved by a resin adhesive 34 as a connecting member. Since the electrical conductivity is not required for the connection in the second support section 25, the resin adhesive 34 as the connecting member is not required to have an electrical conductivity. By connecting the resonator element 15 with the electrically-conductive adhesive 23 including resin as described above, the stress relaxation of the resonator element 15 can be achieved due to the resin included in the electrically-conductive adhesive 23, and at the same time, it becomes possible to ensure the electrical conductivity.

It should be noted that it is also possible to use a metal bonding material (e.g., a gold bump) or an alloy bonding material (e.g., a bump made of gold-tin alloy or solder) as the connecting member instead of the electrically-conductive adhesive 23. By using such a connecting member, it is possible to achieve the electrically-conductive connection of the resonator element 15 with a small area and a suppressed variation in bonding area, and it becomes possible to further stabilize the resonator characteristics of the resonator element 15.

Further, the connection electrode 17 disposed on the obverse principal surface is electrically connected to the PAD electrode 42 disposed on the bottom plate 10 with a bonding wire (metal wiring) 29 extending from the vicinity of a portion overlapping the base section 21b of the plate spring 30 in a planar view. The PAD electrode 42 is electrically connected to at least one of the external connection electrodes 33 formed on the outer bottom portion of the package 13.

As described above, the resonator element 15 is held by the base section 21b, the first support section 24, and the second support section 25 of the plate spring 30, and is fixed at the first support section 24 and the second support section 25 in the internal space 14 of the package 13, and the vibrating portion thereof is disposed in the air. By holding and fixing the resonator element 15 with the plate spring 30 so as to be disposed in the air, the impact force generated when, for example, a drop impact is applied to the vibrator 1 is absorbed by the elasticity of the plate spring 30, and thus, it is possible to enhance a so-called buffering action for reducing the impact force applied to the resonator element 15.

Figure 5:
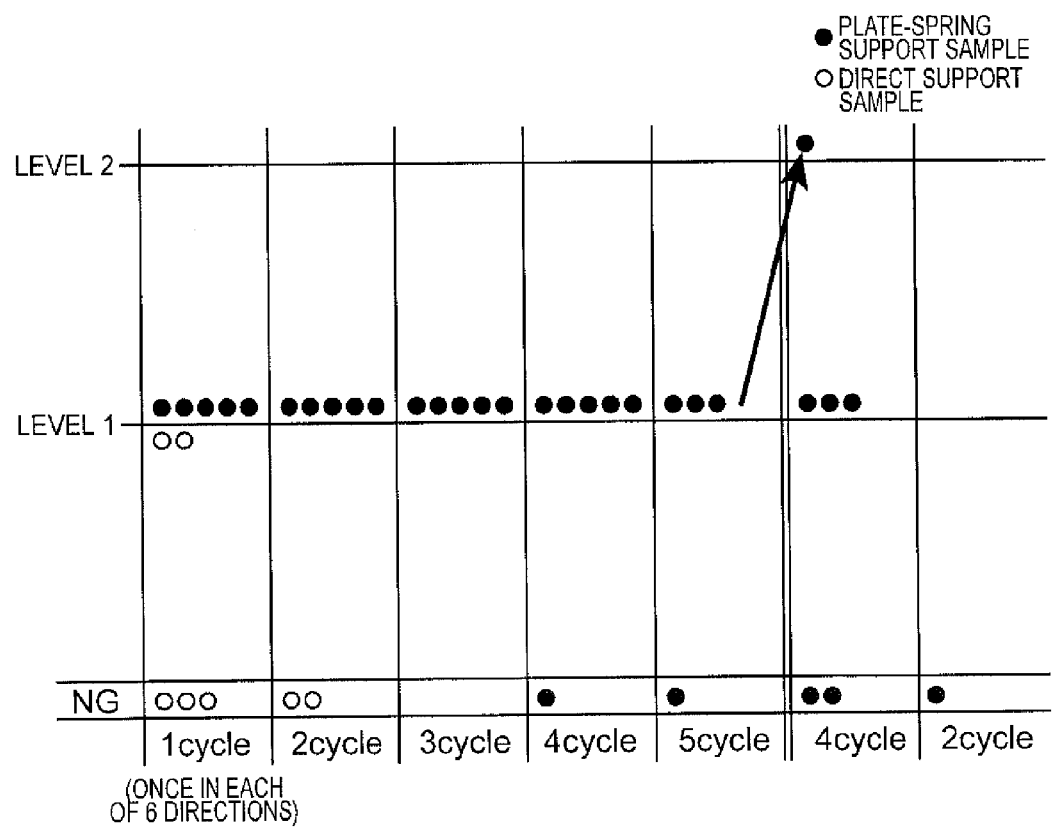
FIG. 5 is a graph showing the drop impact resistance of the vibrator according to the first embodiment.

This effect will be explained with reference to FIG. 5. FIG. 5 is a graph showing a drop impact resistance of the vibrator 1 according to the first embodiment, wherein the vertical axis represents a dropping level, and the horizontal axis represents the number of times of dropping. It should be noted that in the number of times of dropping represented by the horizontal axis, one dropping cycle denotes the state in which a dropping sample is dropped once in each of six directions, and then whether or not a breakage occurs is tested. Further, in the drawing, the black circle (●) represents the vibrator 1 according to the first embodiment using the plate spring 30, and the white circle (○) represents a related-art vibrator having a direct connection structure, and the drawing shows an evaluation result using five samples. In the drawing, the samples with no breakage having occurred in each of the dropping cycles are plotted on the horizontal lines of the level 1 and the level 2, and the samples with the breakage having occurred are plotted on the horizontal line of "NG."

As shown in FIG. 5, in the related art products, the breakage occurred in 3/5 samples in one cycle at the level 1, and the rest two thereof were broken in two cycles. In contrast, in the vibrators 1 according to the first embodiment using the plate spring 30, no breakage was observed in all of the samples up to three cycles at the level 1. Subsequently, the breakage occurred in four or more cycles. However, it is understood that the impact resistance is obviously improved compared to the related-art products.

Lid as Lid Member

The lid 26 is a plate-like member, and is bonded to the periphery of the opening of the recessed section (the housing space) opening in the upper surface of the package 13 using, for example, a seam welding method so as to block the opening of the recessed section. The lid 26 according to the present embodiment has a plate-like shape, and is therefore easy to form, and is further superior in stability of the shape. Further, a kovar plate material is used as the lid 26 of the present embodiment. By using the kovar plate as the lid 26, the seal ring 40 formed of kovar and the lid 26 are melted in the same molten state in the sealing process, and further, the alloying occurs easily. Therefore, sealing can easily and reliably be performed. It should be noted that it is also possible to use a plate made of another material as the lid 26 instead of kovar, a metal material such as 42Alloy or stainless steel, the same material as the side wall 11 of the package 13, and so on can be used.

According to the vibrator 1 related to the first embodiment of the resonator device described above, the plate spring 30 is connected to the heat generation element 20 as the base body, and the resonator element 15 is connected to the first support section 24 as the elastic member and the second support section 25 as the elastic member of the plate spring 30, which are located distant from the heat generation element 20 as the base body. By supporting with a cantilever structure and connecting the resonator element 15 using the elastic members as described above, the stress of the resonator element 15 caused by the temperature change and so on is absorbed or released by the deflection of the plate spring 30, and thus, the degradation of the resonator characteristics of the resonator element 15 due to the influence of the stress can be prevented.

Further, since the stress of the resonator element 15 can be absorbed or released by the plate spring 30, it becomes possible to increase the fixation area (the plane areas of the electrically-conductive adhesive 23 and the resin adhesive 34) of the resonator element 15, and in addition, due to the buffering effect of the impact force and so on obtained by supporting the resonator element 15 with the plate spring 30, it becomes possible to improve the support strength of the resonator element 15.

Further, since the resonator element 15 is supported and connected (fixed) by the first support section 24 and the second support section 25 as the support sections provided to the respective two support arms (the first support arm 21 and the second support arm 22) as the elastic members disposed in the region on the one side of the heat generation element 20 as the base body, the fixation posture of the resonator element 15 can further be stabilized, and at the same time, it becomes possible to surely achieve the fixation of the resonator element 15.

Second Embodiment

Figure 6A:
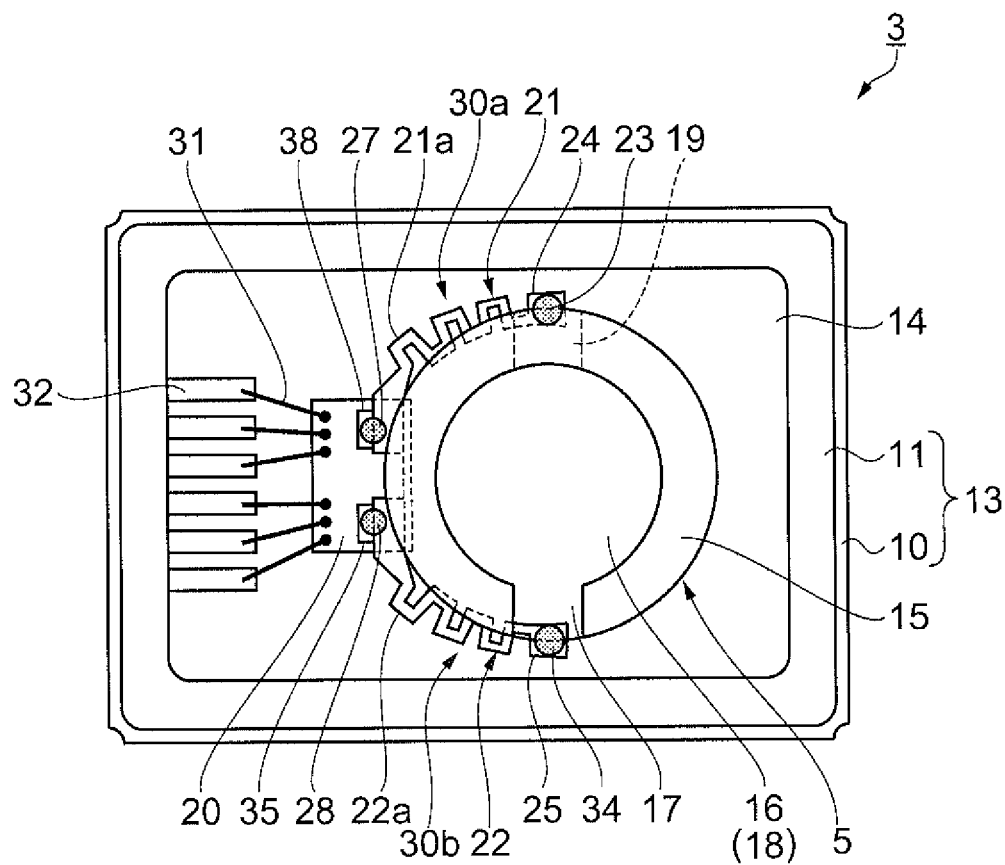
Figure 6B:
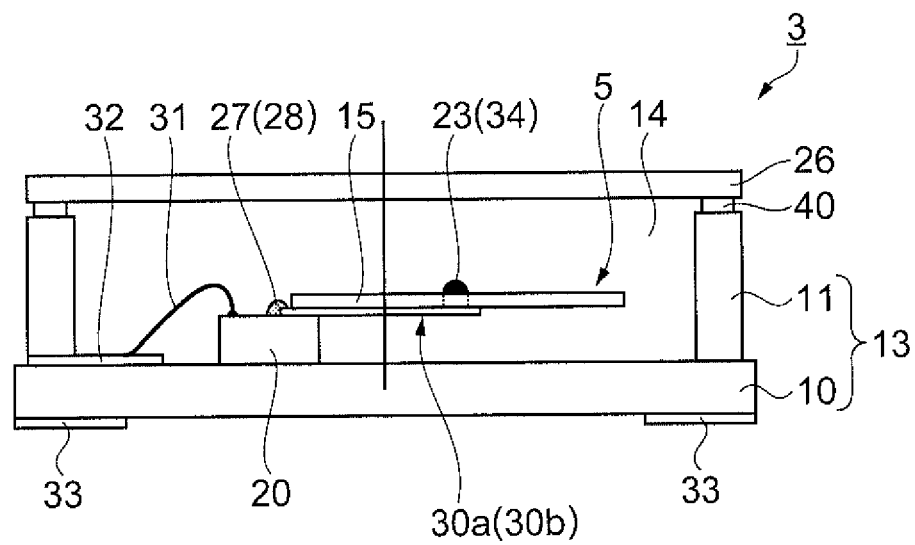
Figure 7A:
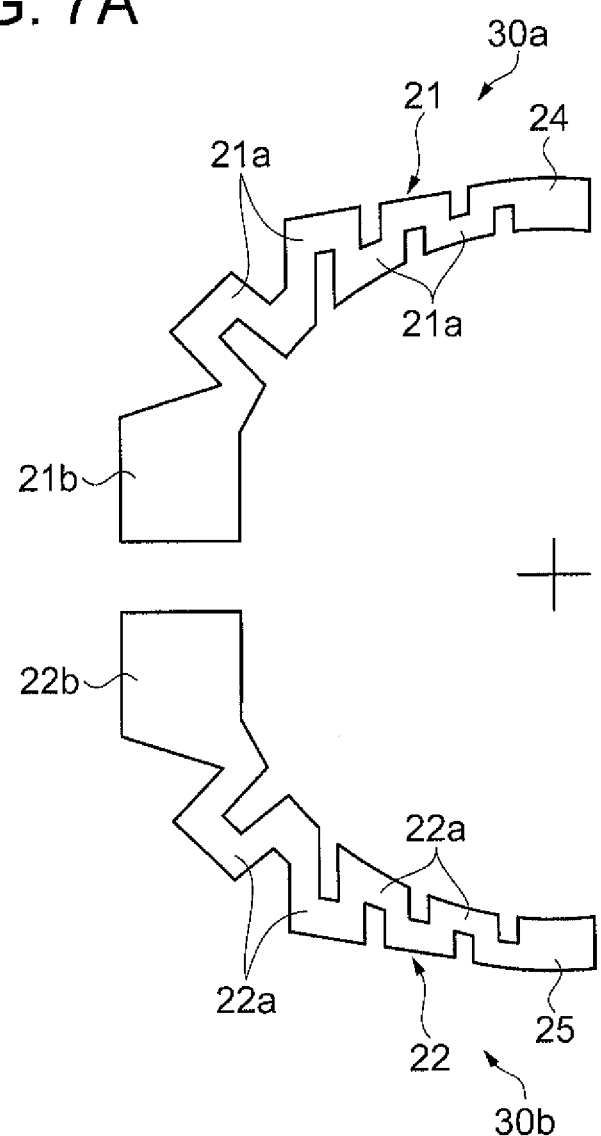
Figure 7B:
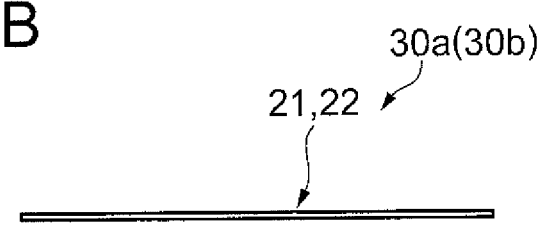

Then, a vibrator according to the second embodiment of the resonator device according to the invention will be explained using FIGS. 6A, 6B, 7A, and 7B. FIGS. 6A and 6B are diagrams showing a general configuration of the vibrator according to the second embodiment of the resonator device according to the invention, wherein FIG. 6A is a plan view, and FIG. 6B is a front cross-sectional view. FIGS. 7A and 7B show a plate spring used in the vibrator according to the second embodiment, wherein FIG. 7A is a plan view, and FIG. 7B is a front view. It should be noted that in the explanation of the second embodiment, the same constituents as in the first embodiment described above are denoted with the same reference symbols, and the detailed explanation thereof might be omitted.

As shown in FIGS. 6A and 6B, the vibrator 3 includes the resonator element 15 using the resonator substrate 5, the heat generation element 20 as a base body, a first plate spring 30a and a second plate spring 30b as plate springs disposed for attaching the resonator element 15 to the heat generation element 20 as the base body, the package 13 for housing the resonator element 15, the heat generation element 20, and so on, and the lid 26 as the lid member for forming the internal space 14 as the housing space with the package 13. Here, the vibrator 3 according to the second embodiment and the vibrator 1 according to the first embodiment described above are different in that the plate spring disposed for attaching the resonator element 15 to the heat generation element 20 as the base body is disposed so as to be divided into two parts, namely the first plate spring 30a and the second plate spring 30b. Therefore, in the explanation of the second embodiment, the explanation will be presented with a focus on the plate spring (the first plate spring 30a and the second plate spring 30b) different in configuration from that of the first embodiment. It should be noted that the heat generation element 20 of the present embodiment is provided with connection terminals 35, 38 as two electrodes to be connected respectively to the plate springs (the first plate spring 30a and the second plate spring 30b).

As shown in FIGS. 6A, 6B, 7A, and 7B, as the plate springs, there are disposed the first plate spring 30a and the second plate spring 30b. The first plate spring 30a and the second plate spring 30b are disposed so as to have roughly line-symmetric shapes about a center line (an imaginary line) passing through the center of the resonator element 15 in a direction along a long side of the package 13. Further, the first plate spring 30a and the second plate spring 30b are distant from the heat generation element 20 as the base body, and at the same time, supported in a cantilever manner so as to be positioned in the air in the internal space 14. The first plate spring 30a is provided with a first support arm 21 as the elastic member extending from one side of the base section 21b toward the tip portion so as to have a thin-width shape of about 0.2 mm through 0.3 mm. Similarly, the second plate spring 30b is provided with a second support arm 22 as the elastic member extending from one side of the base section 22b toward the tip portion so as to have a thin-width shape of about 0.2 mm through 0.3 mm. The first plate spring 30a and the second plate spring 30b are each formed of a plate material having a thickness of about 0.05 mm. It should be noted that it is preferable that the plate springs 30 are each formed to have a thickness of 0.025 mm through 0.20 mm. By adopting the plate springs having such a thickness, it becomes possible to make the plate springs 30 easy to form, capable of surely holding (supporting) the resonator element 15, and suitable for the stress relaxation in the thickness direction of the resonator element 15.

Further, the base section 21b of the first plate spring 30a is mounted on the functional surface of the heat generation element 20 and is connected to the connection terminal 38 disposed on the functional surface side providing the electrical conductivity with the electrically-conductive adhesive 27 as an electrically-conductive member. Further, the base section 22b of the second plate spring 30b is mounted on the functional surface of the heat generation element 20 and is connected to the connection terminal 35 disposed on the functional surface side providing the electrical conductivity with the electrically-conductive adhesive 28 as an electrically-conductive member. By using the configuration of dividing the plate spring into the two plate springs (the first plate spring 30a and the second plate spring 30b) as described above, it is possible to achieve the connection between the excitation electrode 16 of the resonator element 15 and the connection electrode 17 using the second plate spring 30b, and to achieve the connection between the excitation electrode 18 and the connection electrode 19 using the first plate spring 30a. As described above, the electrical connection to the excitation electrodes 16, 18 of the resonator element 15 can be achieved using the respective plate springs (the first plate spring 30a and the second plate spring 30b).

It should be noted that, in the connection between the first plate spring 30a, the second plate spring 30b, and the heat generation element 20, a metal bonding material (e.g., a gold bump) or an alloy bonding material (e.g., a bump made of a gold-tin alloy or solder) can be used as the electrically-conductive material. By performing such connection, the connection between the plate spring 30 and the heat generation element 20 achieving the electrical connection can easily be performed.

In the end portion of the first support arm 21 on the opposite side to the base section 21b, there is disposed the first support section 24 for supporting the resonator element 15. Similarly, in the end portion of the second support arm 22 on the opposite side to the base section 21b, there is disposed the second support section 25 for supporting the resonator element 15. In a portion of the first support arm 21 between the base section 21b and the first support section 24, there is disposed a plurality of bent portions 21a alternately folded while extending to form a thin-width shape. Similarly, in a portion of the second support arm 22 between the base section 22b and the second support section 25, there is disposed a plurality of bent portions 22a alternately folded while extending to form a thin-width shape. By providing the pluralities of bent portions 21a, 22a respectively to the first support arm 21 and the second support arm 22 as described above, it is possible to make it easier for the plate spring 30 to be deflected in the planar direction, and the relaxation of the stress in the planar direction generated in the resonator element 15 can efficiently be achieved.

The outer shapes of the first plate spring 30a and the second plate spring 30b are each formed by performing an etching process on a plate material having a spring property (elasticity) such as a phosphor-bronze plate. It should be noted that it is sufficient for the material for forming the first plate spring 30a and the second plate spring 30b to be an elastic material, but it is preferable to use copper or a copper alloy such as beryllium copper. Since copper, the phosphor-bronze plate, or copper alloys such as beryllium copper has a high electrical conductivity, a good heat conductivity, and a good spring property, by using copper, the phosphor-bronze plate or other copper alloys such as beryllium copper as the elastic material, the stress relaxation of the resonator element 15 can also be achieved while ensuring the electrical conductivity and the conductivity of the heat energy between the resonator element 15 and the heat generation element 20.

Attachment of Resonator Element

The resonator element 15 is housed inside the recessed section surrounded by the side wall 11 of the package 13. The resonator element 15 is disposed so that the connection electrode 17 on the obverse principal surface (the first principal surface) and the second support section 25 of the second plate spring 30b overlap each other, and the connection electrode 19 on the reverse principal surface (the second principal surface) side and the first support section 24 of the first support arm 21 overlap each other in a planar view. Further, the connection electrode 19 of the resonator element 15 and the first support section 24 are connected to each other, and the connection electrode 17 of the resonator element 15 and the second support section 25 are connected to each other, with, for example, electrically-conductive adhesives 23, 34 including polyimide resin as connecting members (electrically-conductive members). In such connection of the resonator element 15 with the electrically-conductive adhesives 23, 34 including resin, the stress relaxation of the resonator element 15 can be achieved due to the resin included in the electrically-conductive adhesives 23, 34, and at the same time, it becomes possible to ensure the electrical conductivity.

It should be noted that it is also possible to use a metal bonding material (e.g., a gold bump) or an alloy bonding material (e.g., a bump made of gold-tin alloy or solder) as the connecting member instead of the electrically-conductive adhesives 23, 34. By using such a connecting member, it is possible to achieve the electrically-conductive connection of the resonator element 15 with a small area and a suppressed variation in bonding area, and it becomes possible to further stabilize the resonator characteristics of the resonator element 15.

According to the vibrator 3 related to the second embodiment of the resonator device described above, the following advantages can be obtained in addition to the advantages of the vibrator 1 according to the first embodiment. In the vibrator 3, since the first support section 24 of the first plate spring 30a and the second support section 25 of the second plate spring 30b are connected and fixed to the connection electrodes 17, 19 of the resonator element 15 with the electrically-conductive adhesives 23, 34, respectively, the electrical connection to the excitation electrodes 16, 15 of the resonator element 15 can be obtained. Since the fixation and the electrical connection of the resonator element 15 can be achieved at the same time in such a manner as described above, the efficient assembling of the vibrator 3 can be performed.

Third Embodiment

Figure 8A:
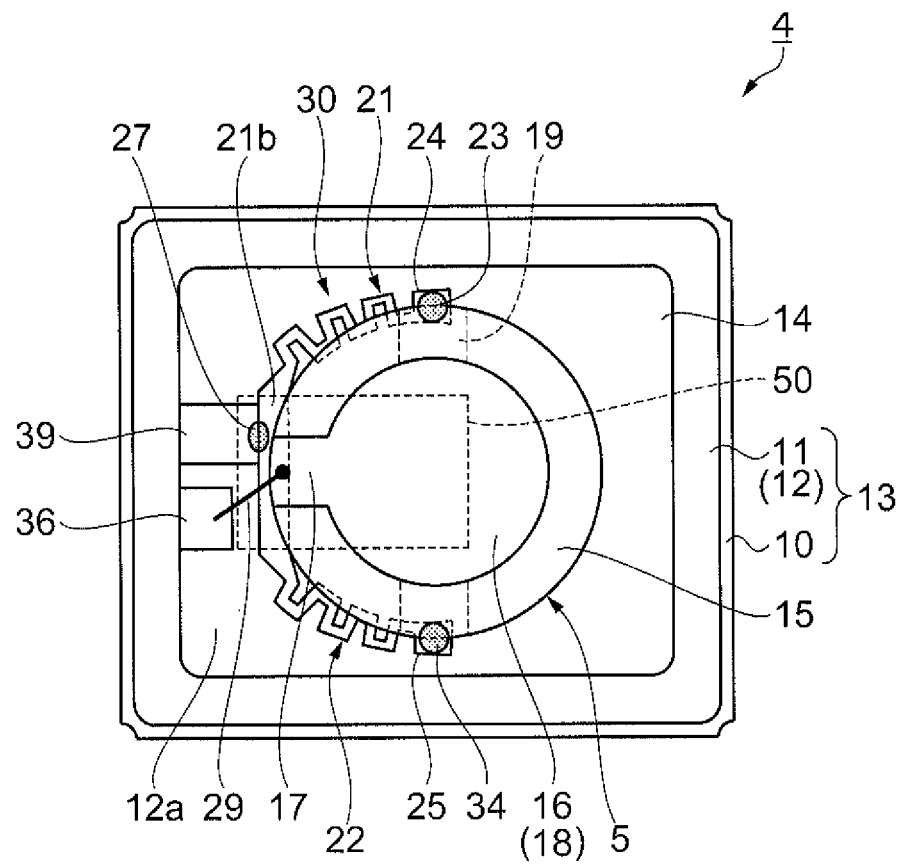
Figure 8B:
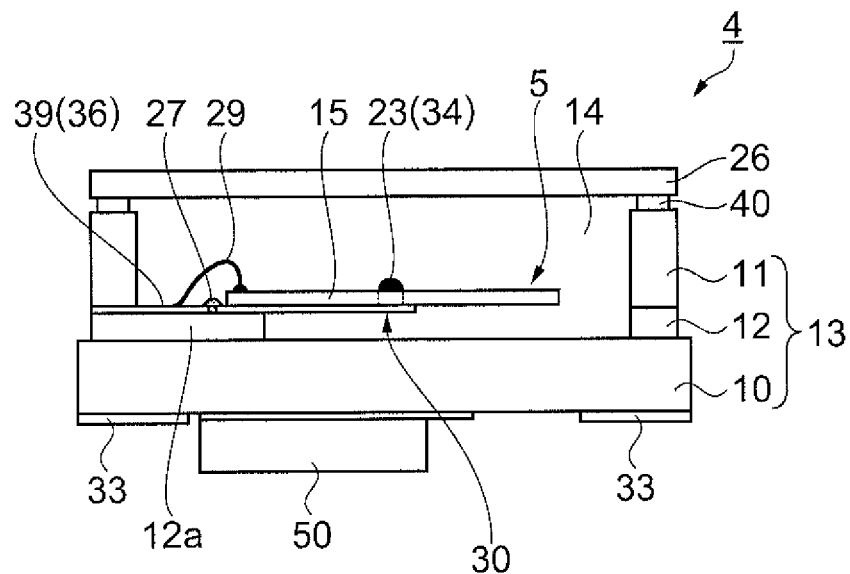

Then, a vibrator according to a third embodiment of the resonator device according to the invention will be explained using FIGS. 8A and 8B. FIGS. 8A and 8B are diagrams showing a general configuration of the vibrator according to the third embodiment of the resonator device according to the invention, wherein FIG. 8A is a plan view, and FIG. 8B is a front cross-sectional view. It should be noted that in the explanation of the third embodiment, the same constituents as in the first embodiment described above are denoted with the same reference symbols, and the detailed explanation thereof might be omitted.

As shown in FIGS. 8A and 8B, the vibrator 4 according to the third embodiment includes the resonator element 15 using the resonator substrate 5, a heat generation element 50 for heating the resonator element 15, the plate spring 30 disposed for attaching the resonator element 15 to the base body, the package 13 as the base body for housing the resonator element 15, the heat generation element 50, and so on, and the lid 26 as the lid member for forming the internal space 14 as the housing space with the package 13. Here, the vibrator 4 of the third embodiment is different from the vibrator 1 of the first embodiment described above in that the heat generation element 50 is connected to the outer bottom portion of the package 13, and a frame-like substrate 12 as the base body is provided to the package 13 as the base substrate, and the plate spring 30 is connected to the frame-like substrate 12. In the explanation of the third embodiment, the explanation will be presented with a focus on the different configuration described above, and the detailed explanation of the configuration of the plate spring 30, the resonator element 15, and the heat generation element 50 will be omitted.

Package

The package 13 as the base substrate shown in FIGS. 8A and 8B includes the bottom plate 10, the frame-like substrate 12 provided with a platform section 12a disposed on a peripheral edge portion of one surface of the bottom plate 10, the side wall 11 having a frame-like shape disposed on a peripheral edge portion of one surface of the frame-like substrate 12, and the seal ring 40 as the bonding material disposed on the upper surface of the side wall 11. Here, the platform section 12a constituting the frame-like substrate 12 corresponds to the base body in the present embodiment. The package 13 is for housing the resonator element 15, the plate spring 30, and so on.

The package 13 as the base substrate has the recessed section (the internal space 14) opening in the upper surface. The opening of the recessed section is blocked by the lid 26 as the lid member bonded to the side wall 11 via the seal ring 40 as the bonding material. Thus, there is formed the internal space 14 sealed by blocking the opening of the recessed section of the package 13. The inner pressure of the internal space 14 thus sealed can be set to a desired pressure. For example, by filling the internal space 14 with a nitrogen gas to set the internal pressure to the atmospheric pressure, or by creating the vacuum state similarly to the first embodiment, a more stable vibration of the resonator element 15 can be continued, wherein the vacuum state is set in the present embodiment.

The frame-like substrate 12 constituting the package 13 has the platform section 12a projecting toward the central side from the side wall 11 in a planar view. The platform section 12a has a step from the upper surface of the bottom plate 10, which is formed by the inner end surface along one side, disposed on one side of the package 13. The platform section 12a functions as the base body, and the base section 21b of the plate spring 30 is connected to the platform section 12a. Since the platform section 12a has the step from the upper surface of the bottom plate 10, the first support arm 21 and the second support arm 22 of the plate spring 30 are distant from the platform section 12a as the base body, and at the same time, supported in a cantilever manner so as to be positioned in the air in the internal space 14.

PAD electrodes 36, 39 are formed on the upper surface of the platform 12a. The PAD electrodes 36, 39 are each formed by forming the necessary shape using, for example, an electrically-conductive paste made of a silver-palladium alloy or the like, or tungsten metalizing, then performing a calcination treatment, and then plating the result with nickel, gold, silver, or the like. The PAD electrodes 36, 39 are disposed so as to be connected respectively to the connection electrodes 17, 19 of the resonator element 15 via the plate spring 30, and are electrically connected to the external connection electrodes (not shown) formed on the outer bottom portion of the package 13. A bonding wire 29 wired from the connection electrode 17 of the excitation electrode 16 on the obverse principal surface side of the resonator element 15 is connected to the PAD electrode 36. Further, the base section 21b of the plate spring 30 is connected to the PAD electrode while achieving the electrical connection using, for example, the electrically-conductive adhesive 27 including resin.

It should be noted that since the side wall 11 and so on as other constituents of the package 13 are substantially the same as those in the first embodiment, the explanation thereof will be omitted here.

Attachment of Resonator Element

The resonator element 15 is housed inside the recessed section surrounded by the side wall 11 of the package 13. The resonator element 15 is disposed so that the connection electrode 17 on the obverse principal surface (the first principal surface) and the base section 21b of the plate spring 30 overlap each other, and the connection electrode 19 on the reverse principal surface (the second principal surface) side and the first support section 24 of the first support arm overlap each other in a planar view. Further, the connection electrode 19 of the resonator element 15 and the first support section 24 are connected to each other with, for example, an electrically-conductive adhesive 23 including polyimide resin as a connecting member. Further, in the second support section 25, the connection is achieved by a resin adhesive 34 as a connecting member. Since the electrical conductivity is not required for the connection in the second support section, the resin adhesive 34 as the connecting member is not required to have an electrical conductivity. In such connection of the resonator element 15 with the electrically-conductive adhesive 23 including resin, the stress relaxation of the resonator element 15 can be achieved due to the resin included in the electrically-conductive adhesive 23, and at the same time, it becomes possible to ensure the electrical conductivity. It should be noted that it is also possible to use a metal bonding material (e.g., a gold bump) or an alloy bonding material (e.g., a bump made of gold-tin alloy or solder) as the connecting member instead of the electrically-conductive adhesive 23.

Further, the connection electrode 17 disposed on the obverse principal surface is electrically connected to the PAD electrode 36 disposed on the bottom plate 10 with the bonding wire (metal wiring) 29 extending from the vicinity of a portion overlapping the base section 21b of the plate spring 30 in a planar view. The PAD electrode 36 is electrically connected to at least one of the external connection electrodes 33 formed on the outer bottom portion of the package 13.

Attachment of Heat Generation Element

The heat generation element (the heating element) 50 is disposed so as to overlap a part of the platform section 12a and the resonator element 15 in a planar view, and is connected to the outer bottom portion of the package 13 (the bottom plate 10) with a bonding material not shown having a good heat conductivity. In such an arrangement of the heat generation element 50, since the heat energy of the heat generation element 50 is conducted from the platform section 12a directly connected thereto to the plate spring 30, and the heat energy of the bottom plate 10 heated by the heat generation element 15 having contact with the bottom plate 10 is added as radiant heat to the resonator element 15 opposed to the bottom plate 10, heating of the resonator element 15 can efficiently be performed.

According to the vibrator 4 related to the third embodiment of the resonator device described above, substantially the same advantages as those of the vibrator 1 according to the first embodiment can be obtained. In addition, according to the vibrator 4, the heat energy generated by the heat generation element 50 can be diffused in the large area using the bottom plate 10, and it is possible to heat the package 13 with the large area. Thus, it becomes possible to heat (warm) the package 13 at an even temperature.

It should be noted that although in the first through third embodiments described above, the explanation is presented with the example using the crystal substrate having the roughly circular outer shape as the resonator element 15, the outer shape of the crystal substrate other than the roughly circular shape can also be applied. For example, by using the resonator substrate having a roughly square outer shape or a rectangular outer shape, substantially the same advantages as described above are obtained.

Further, although in the first through third embodiments described above, the explanation is presented using the quartz crystal as the piezoelectric material for forming the resonator element 15, the piezoelectric material is not limited to the quartz crystal, but a piezoelectric material such as lithium tantalite or lithium niobate can also be used. Further, the resonator element 15 can also be an MEMS (Micro Electra Mechanical Systems) element having the resonator element formed on a silicon or glass substrate. Further, the resonator element 15 can also be a resonator element having a vibrating body formed on a substrate such as a silicon substrate or a glass substrate.

Fourth Embodiment

Figure 9:
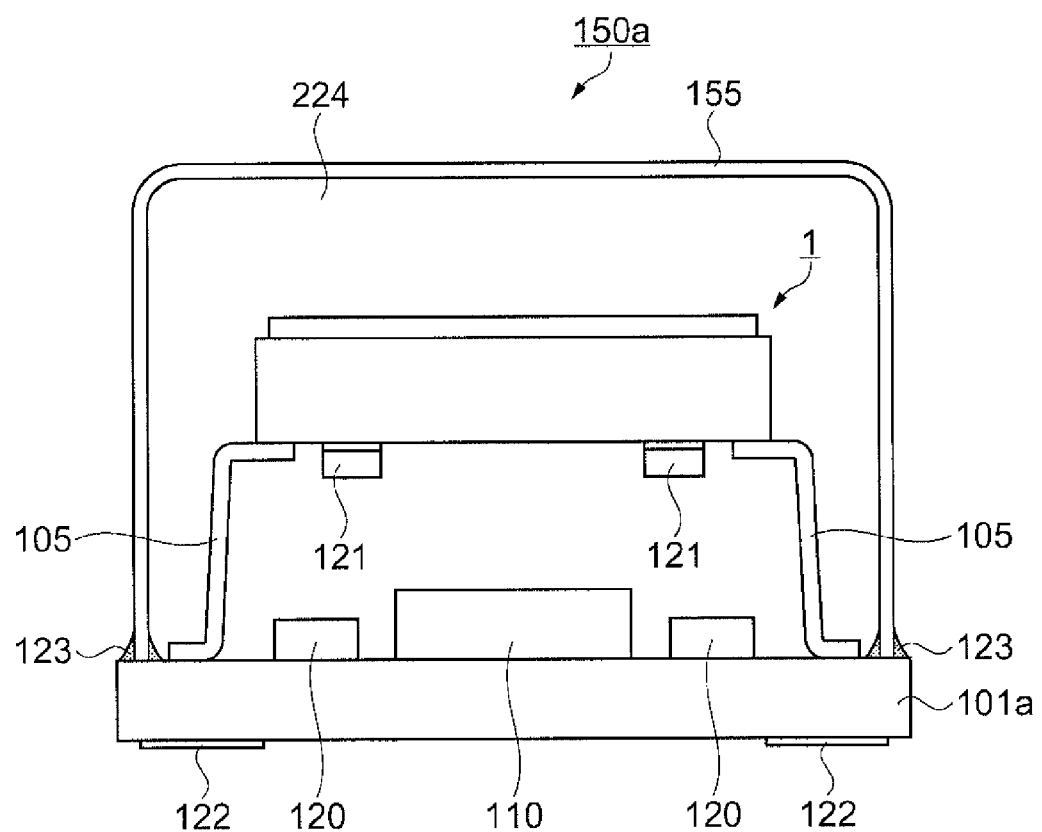
FIG. 9 is a front cross-sectional view showing a general configuration of an oscillator according to a fourth embodiment of the resonator device according to the invention.

Then, an oscillator according to a fourth embodiment of the resonator device according to the invention will be explained using FIG. 9. FIG. 9 is a front cross-sectional view showing a general configuration of the oscillator according to the fourth embodiment of the resonator device according to the invention. It should be noted that the vibrator used for the oscillator according to the present embodiment has the same configuration as that of the first embodiment described above. Therefore, in the following explanation, the vibrator 1 is denoted with the same reference numeral and the detailed explanation thereof will be omitted.

The oscillator 150a shown in FIG. 9 has an internal space 224 formed by a cap 155 made of metal or resin covering over a printed board 101a. The cap 155 is connected to a surface of the printed board 101a using solder 123 or the like. The internal space 224 can be "non-air-tight," namely exposed to the atmosphere, or can be an air-tight space. In the internal space 224, there are provided the vibrator 1 connected to the printed board 101a with a connection plate 105, and a circuit element 110 connected to the surface of the printed board 101a. The vibrator 1 is disposed so as to be opposed to the printed board 101a, and is connected to the printed board 101a via the connection plate 105. It should be noted that the connection plate 105 also has a function of achieving electrical connection between the vibrator 1 and the printed board 101a. The circuit element 110 has at least a function of controlling the heat generation element 20 (not shown) as the base body in the vibrator 1. Further, on the reverse surface of the vibrator 1, there can also be provided other circuit constituents 121. Further, on the printed board 101a, there can also be provided electronic components 120 in addition to the circuit element 110. On the reverse side (the external surface) of the printed board 101a, there are disposed external connection terminals 122. Although not shown in the drawing, the external connection terminals 122 are electrically connected to the circuit element 110, the electronic components 120, and so on.

In the oscillator 150a according to the fourth embodiment, since the advantages of the vibrator 1 according to the first embodiment described above, it becomes possible to provide the oscillator 150a using the vibrator 1, which can suppress the variation in frequency due to the change in temperature of the use environment, and improves in accuracy of the so-called frequency-temperature characteristics. In other words, it becomes possible to provide the oscillator 150a reduced in the characteristic variation due to the change in temperature of the use environment. It should be noted that although in the fourth embodiment, the explanation is presented citing the oscillator 150a as an example, substantially the same configuration can also be applied to a so-called temperature-compensated vibrator not equipped with the circuit element 110.

Modified Example of Plate Spring

Figure 10A:
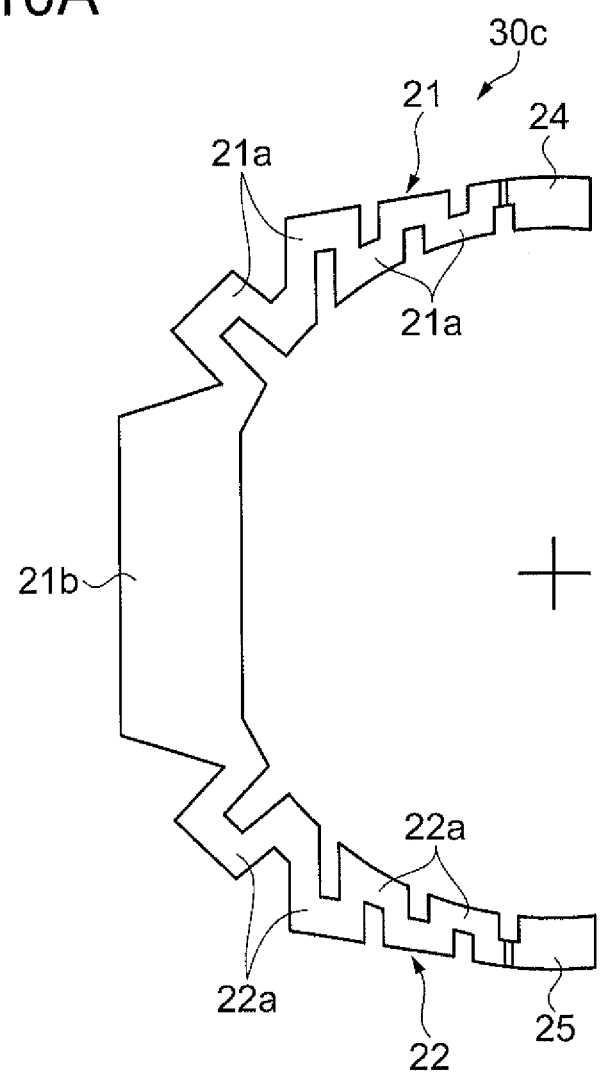
Figure 10B:
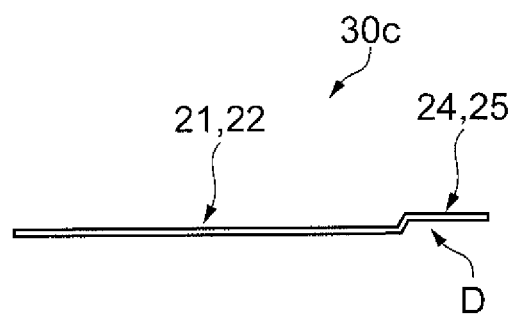

Here, a modified example of the plate spring will be explained using FIGS. 10A and 10B. FIGS. 10A and 10B show the modified example of the plate spring, wherein FIG. 10A is a plan view, and FIG. 10B is a front view. Although in the embodiments described above, the explanation is presented using the plate springs 30, 30a, and 30b having the flat-plate shape as an example, the shape of the plate spring is not limited to the flat-plate shape. For example, as shown in FIGS. 10A and 10B, the plate spring 30c can also have a configuration provided with step sections D each formed by bending the plate in the thickness direction using a step-forming (depressing) process. The plate spring 30c is provided with the step sections D in the respective tip portions of the first support arm 21 and the second support arm 22. Further, the first support section 24 is disposed in the step section D of the first support arm 21, and the second support section 25 is disposed in the step section D of the second support arm 22. It should be noted that the step section D can also have a configuration in which the bent sections are disposed in other regions than the respective tip portions of the first support arm 21 and the second support arm 22, or a configuration in which a plurality of bent sections is disposed in each of the first support arm 21 and the second support arm 22.

By providing the step sections D formed by the step-forming process as in the plate spring 30c, the first support arm 21 and the second support arm 22 have contact with the resonator element 15 only at the positions of the first support section 24 and the second support section 25. In other words, it is possible to limit the contact places of the first support arm 21 and the second support arm 22 with the resonator element 15. Thus, it becomes possible to prevent the unwanted contact of the first support arm 21 and the second support arm 22 with the resonator element 15 from affecting the resonator characteristics.

Electronic Apparatus

Then, the electronic apparatuses to which either one of the vibrators 1, 3, and 4, and the oscillator 150a according to the embodiments of the invention is applied will be explained in detail with reference to FIGS. 11 through 13. It should be noted that in the explanation, examples to which the vibrator 1 equipped with the resonator element 15 is applied are described.

Figure 11:
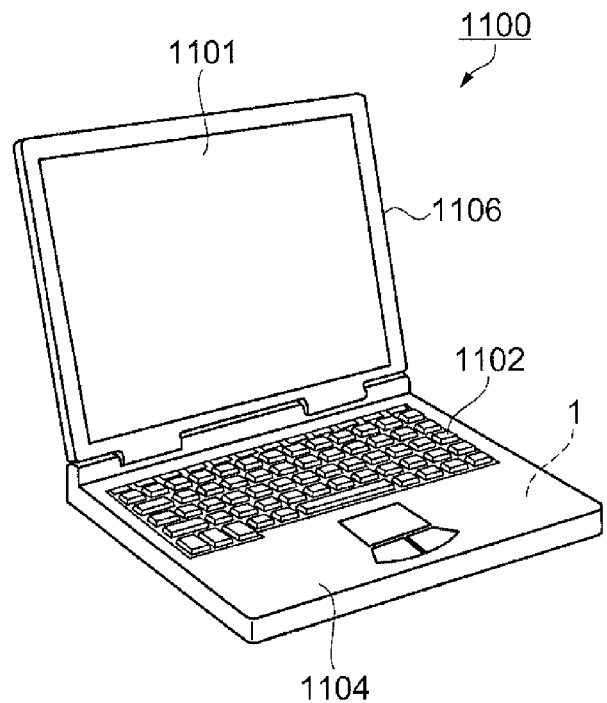
FIG. 11 is a perspective view showing a configuration of a mobile personal computer as an example of the electronic apparatus.

FIG. 11 is a perspective view showing a schematic configuration of a mobile type (or a laptop type) personal computer as the electronic apparatus equipped with the vibrator 1 according to an embodiment of the invention. In the drawing, the personal computer 1100 includes a main body section 1104 provided with a keyboard 1102, and a display unit 1106 provided with a display section 1101, and the display unit 1106 is pivotally supported with respect to the main body section 1104 via a hinge structure. Such a personal computer 1100 incorporates the vibrator 1 provided with a function as a timing source for signal processing.

Figure 12:
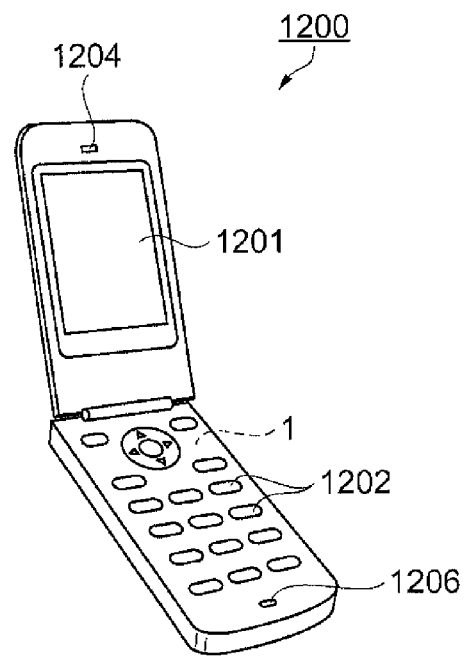
FIG. 12 is a perspective view showing a configuration of a cellular phone as an example of the electronic apparatus.

FIG. 12 is a perspective view showing a schematic configuration of a cellular phone (including PHS) as the electronic apparatus equipped with the vibrator 1 according to an embodiment of the invention. In this drawing, the cellular phone 1200 is provided with a plurality of operation buttons 1202, an ear piece 1204, and a mouthpiece 1206, and a display section 1201 is disposed between the operation buttons 1202 and the ear piece 1204. Such a cellular phone 1200 incorporates the vibrator 1 provided with a function as a timing source for signal processing.

Figure 13:
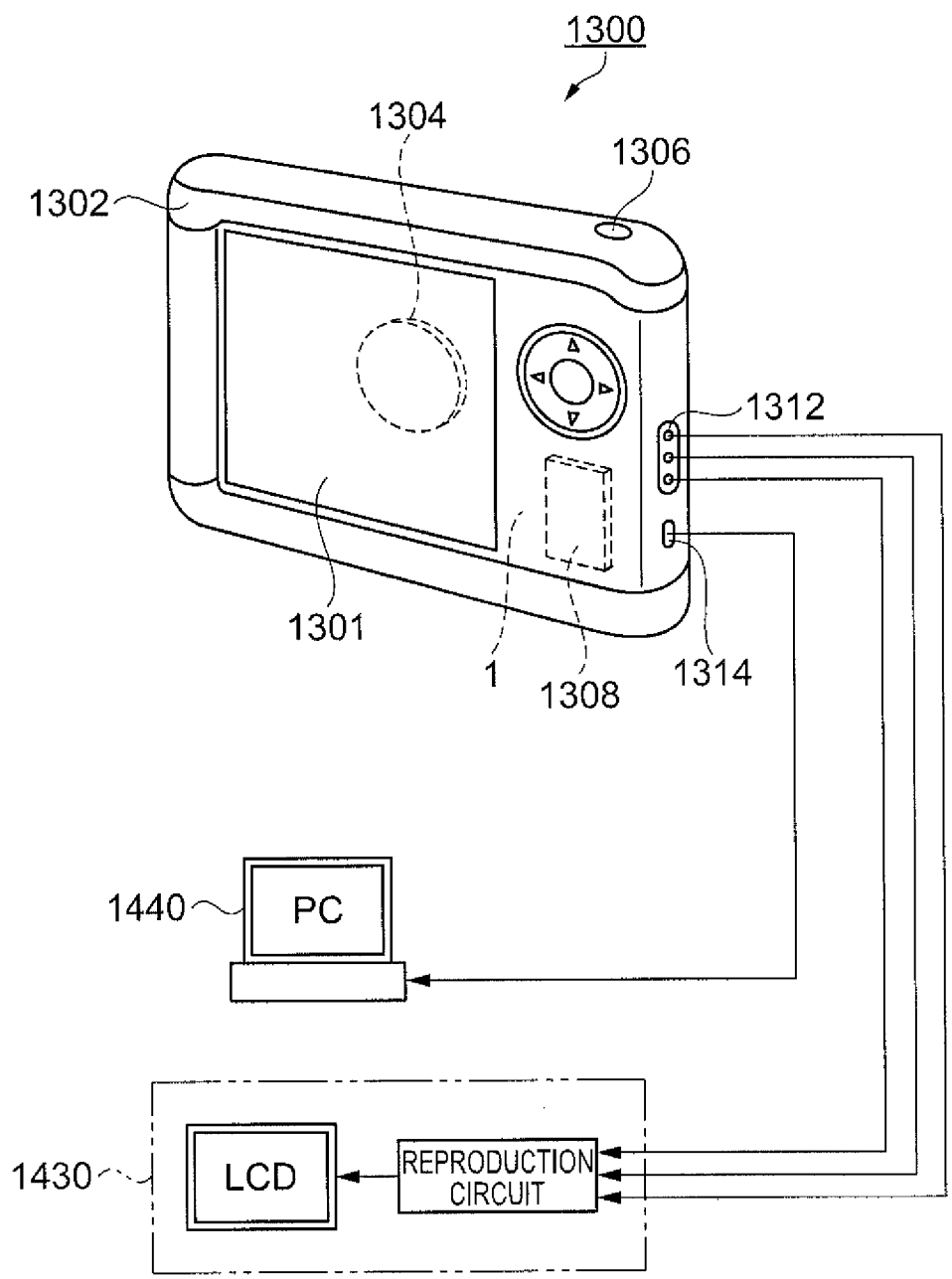
FIG. 13 is a perspective view showing a configuration of a digital still camera as an example of the electronic apparatus.

FIG. 13 is a perspective view showing a schematic configuration of a digital still camera as the electronic apparatus equipped with the vibrator 1 according to an embodiment of the invention. It should be noted that the connection with external equipment is also shown briefly in this drawing. Here, the conventional film cameras expose a silver salt photographic film to an optical image of an object, while the digital still camera 1300 performs photoelectric conversion on an optical image of an object by an imaging element such as a CCD (a charge coupled device) to generate an imaging signal (an image signal).

A case (a body) 1302 of the digital still camera 1300 is provided with a display section 1301 disposed on the back surface of the case 1302 to provide a configuration of performing display in accordance with the imaging signal from the CCD, wherein the display section 1301 functions as a viewfinder for displaying the object as an electronic image. Further, the front side (the reverse side in the drawing) of the case 1302 is provided with a light receiving unit 1304 including an optical lens (an imaging optical system), the CCD, and so on.

When the photographer checks an object image displayed on the display section 1301, and then holds down a shutter button 1306, the imaging signal from the CCD at that moment is transferred to and stored in a memory device 1308. Further, the digital still camera 1300 is provided with video signal output terminals 1312 and an input/output terminal 1314 for data communication disposed on a side surface of the case 1302. Further, as shown in the drawing, a television monitor 1430 and a personal computer 1440 are respectively connected to the video signal output terminals 1312 and the input-output terminal 1314 for data communication according to needs. Further, there is adopted the configuration in which the imaging signal stored in the memory device 1308 is output to the television monitor 1430 and the personal computer 1440 in accordance with a predetermined operation. Such a digital still camera 1300 incorporates the vibrator 1 provided with a function as a timing source for signal processing.

It should be noted that, the vibrator 1 according to an embodiment of the invention can also be applied to an electronic apparatus such as an inkjet ejection device (e.g., an inkjet printer), a laptop personal computer, a television set, a video camera, a video cassette recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), and a flight simulator besides the personal computer (the mobile personal computer) shown in FIG. 11, the cellular phone shown in FIG. 12, and the digital still camera shown in FIG. 13. It should be noted that it is suitable for the electronic apparatus used under a severe temperature environment such as a communication base station to use, for example, the oscillator 150a provided with the heat generation element (the heating element) 106 explained in the description of the fourth embodiment.

Moving Object

Figure 14:
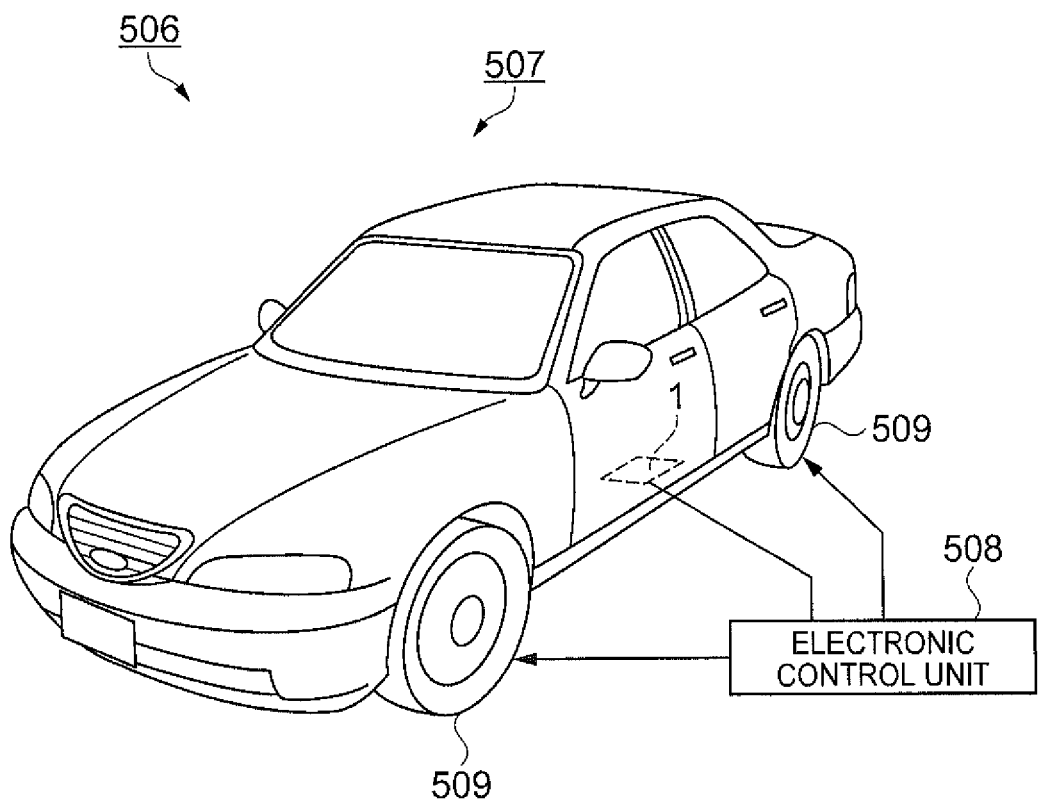
FIG. 14 is a perspective view showing a configuration of a vehicle as an example of a moving object.

FIG. 14 is a perspective view schematically showing a vehicle as an example of the mobile object. The vehicle 506 is equipped with the vibrator 1 according to the embodiment of the invention. For example, as shown in the drawing, in the vehicle 506 as the moving object, an electronic control unit 508 incorporating the vibrator 1 and for controlling tires 509 and so on is installed in a vehicle body 507. Further, besides the above, the vibrator 1 can widely be applied to an electronic control unit (ECU) such as a keyless entry system, an immobilizer, a car navigation system, a car air-conditioner, an anti-lock braking system (ABS), an air-bag system, a tire pressure monitoring system (TPMS), an engine controller, a battery monitor for a hybrid car or an electric car, or a vehicle posture control system.

The entire disclosure of Japanese Patent Application No. 2013-266617, filed Dec. 25, 2013 is expressly incorporated by reference herein.

What is claimed is:

1. A resonator device comprising:
   a base body;
   an elastic member having one end connected to the base body, extending from the one end, and provided with a support section disposed at a position distant from the base body; and
   a resonator element connected to the support section.

2. The resonator device according to claim 1, wherein the elastic member is provided with a bent section in a planar view.

3. The resonator device according to claim 2, wherein the resonator device includes at least two elastic members, and in the elastic members, the extending direction is a direction toward a first region, which is one of regions divided by an imaginary line passing through a center of the base body, and a plurality of support sections from the at least two elastic members are disposed in the first region.

4. The resonator device according to claim 2, further comprising:
   a base substrate having a space in which the resonator element is installed,
   wherein the base body is connected to the base substrate.

5. The resonator device according to claim 1, wherein the resonator device includes at least two elastic members, and
   in the elastic members, the extending direction is a direction toward a first region, which is one of regions divided by an imaginary line passing through a center of the base body, and a plurality of support sections from the at least two elastic members are disposed in the first region.

6. The resonator device according to claim 5, further comprising:
   a base substrate having a space in which the resonator element is installed,
   wherein the base body is connected to the base substrate.

7. The resonator device according to claim 1, further comprising:
   a base substrate having a space in which the resonator element is installed,
   wherein the base body is connected to the base substrate.

8. The resonator device according to claim 7, wherein the base body is provided to the base substrate.

9. The resonator device according to claim 7, wherein the space for the installation is airtightly sealed with a lid member bonded to the base substrate.

10. The resonator device according to claim 1, wherein the base body is a heat generation member.

11. The resonator device according to claim 1, wherein the base body and the elastic member are connected to each other with an electrically-conductive member.

12. The resonator device according to claim 1, wherein
   the base body is provided with an electrode disposed on one surface, and
   the elastic member is connected to the electrode.

13. The resonator device according to claim 1, wherein the elastic member and the resonator element are connected to each other with a connecting member having electrical conductivity.

14. The resonator device according to claim 1, wherein
   the resonator element is provided with excitation electrodes disposed on obverse and reverse surfaces, and
   one of the excitation electrodes is electrically connected to the base body with wire bonding.

15. An electronic apparatus comprising:
   the resonator device according to claim 1.

16. A moving object comprising:
   the resonator device according to claim 1.

* * * * *